United States Patent
Willer et al.

[11] Patent Number: 5,866,452
[45] Date of Patent: *Feb. 2, 1999

[54] PROCESS FOR PRODUCING A SILICON CAPACITOR

[75] Inventors: Josef Willer, Riemerling; Hermann Wendt, Grasbrunn; Herbert Schäfer, Höhenkirchen-Siegertsbrunn, all of Germany

[73] Assignee: Siemens Aktiengesellschaft, Munich, Germany

[ * ] Notice: The term of this patent shall not extend beyond the expiration date of Pat. No. 5,500,385.

[21] Appl. No.: 750,942

[22] PCT Filed: Aug. 7, 1995

[86] PCT No.: PCT/DE95/01036

§ 371 Date: Feb. 10, 1997

§ 102(e) Date: Feb. 10, 1997

[87] PCT Pub. No.: WO96/05620

PCT Pub. Date: Feb. 22, 1996

[30] Foreign Application Priority Data

Aug. 9, 1994 [DE] Germany .......................... 44 28 195.1

[51] Int. Cl.⁶ ................................................ H01L 21/8242
[52] U.S. Cl. ........................... 438/243; 438/249; 438/392
[58] Field of Search .................................... 438/243, 245, 438/246, 249, 392

[56] References Cited

U.S. PATENT DOCUMENTS

| | | |
|---|---|---|
| 4,782,036 | 11/1988 | Becker et al. . |
| 4,889,492 | 12/1989 | Harden et al. . |
| 5,354,710 | 10/1994 | Kawaguchi et al. . |
| 5,500,385 | 3/1996 | Wendt et al. ............................ 437/919 |
| 5,759,903 | 6/1998 | Lehmann et al. . |

FOREIGN PATENT DOCUMENTS 0 528 281  2/1993  European Pat. Off. .

OTHER PUBLICATIONS

S. Fisher et al., "Characterizing B–, P–, and GE–Doped Silicon Oxide Films for Interlevel Dielectrics", Sep. 1993, Solid State Technology, pp. 55–64.

A. Fukuhara et al., "X–Ray Bragg Reflexion and Strain Compensation in Silicon Crystals", J. Appln. Cryst., 1980, pp. 31–33.

A. Heuberger, "Mikromechanik", Mikrofertigung mit Methoden der Halbreitertechnolgie, Springer–Verlag Berlin Heidelberg, New York, London, Paris, Tokyo 1989, pp. 216–237.

*Primary Examiner*—Tuan H. Nguyen
*Attorney, Agent, or Firm*—Hill & Simpson

[57] ABSTRACT

To produce a silicon capacitor, hole apertures at whose surface a conductive zone (40) is formed by doping and whose surface is provided with a dielectric layer (6) and a conductive layer (7) are generated in an n-doped silicon substrate (1). To compensate for mechanical strains in the silicon substrate (1) brought about by the doping of the conductive zone (40), the conductive zone (40) is additionally doped with germanium which is outdiffused from a germanium-doped layer.

11 Claims, 4 Drawing Sheets

PROCESS FOR PRODUCING A SILICON CAPACITOR

BACKGROUND OF THE INVENTION

1. Field of the Invention

The present invention relates generally to a process of producing a capacitor in a hole of a silicon substrate.

2. Description of the Related Art

European Patent Application EP 0 528 281 discloses a silicon capacitor. This comprises an n-doped silicon substrate whose surface is structured in a characteristic way by an electrochemical etching in a fluoride-containing, acidic electrolyte in which the substrate is connected as an anode. In the electrochemical etching, more or less regularly arranged hole structures form at the surface of the substrate. The hole structures have an aspect ratio up into the region of 1:1000. The surface of the hole structures is provided with a dielectric layer and a conductive layer. The conductive layer, dielectric layer and silicon substrate form a capacitor in which, owing to the increase in surface brought about by the hole structures, specific capacitances of up to 100 $\mu$FV/mm$^3$ are achieved. In order to increase the conductivity of the substrate, it is proposed to provide an n$^+$-doped zone at the surface of the hole structures.

Normally, silicon capacitors are produced in silicon wafers. In this process, a bending of the silicon wafers is detected which is associated with mechanical strains due to the n$^+$-doped zone at the surface of the hole structures, which are up to 300 $\mu$m deep. This bending of the silicon wafer results in problems in further process steps such as lithography, reduction in wafer thickness and chip separation, which are necessary for incorporating the silicon capacitor in a package.

The publication by A. Fukuhara et al., J. Appl. Cryst. (1980), vol. 13, pages 31 to 33 discloses a study of the compensation for mechanical strains in silicon crystals. A strain is observed which is essentially proportional to the dopant concentration and which can be compensated for by an additional doping with germanium. Layers 1 to 5 $\mu$m deep are doped with germanium and/or boron. The germanium is introduced by diffusion, an annealing time of 14 days being necessary at a temperature of 1473 degrees K.

The publication by A. Heuberger, Mikromechanik, Springer-Verlag 1989, pages 216–236 discloses that highly boron-doped silicon layers which are used as etch-stop layers in micromechanics and which are grown epitaxially on silicon substrates cause bends in substrates which are compensated for by additionally introducing, for example, germanium into the boron-doped layer.

SUMMARY OF THE INVENTION

The present invention provides a further method of producing a silicon capacitor in which a bending of the silicon substrate is avoided and which can be used in a manufacturing process.

According to the present invention, this object is achieved by a method of producing at least one silicon capacitor, wherein a multiplicity of hole apertures is generated by electrochemical etching in a principal surface of an n-doped silicon substrate, wherein a conductive zone provided with electrically active dopant is generated along the surface of the hole apertures, wherein a germanium-doped layer, by means of which the conductive zone is doped with germanium, is generated on the surface of the hole apertures, wherein a dielectric layer and a conductive layer are applied to the surface of the conductive zone, and wherein the conductive layer and the conductive zone are each provided with a contact. Further developments of the invention include the conductive zone being doped with germanium by outdiffusion from the germanium-doped layer. The germanium-doped layer is deposited by CVD deposition at atmospheric pressure using a process gas containing Ge(OCH$_3$)$_4$ and Si(OC$_2$H$_5$)$_4$.

Preferably, a silicon layer which is doped with germanium in situ by adding a germanium-containing compound during the epitaxy is formed by epitaxy on the surface of the hole apertures. A further undoped silicon layer is grown by epitaxy on the germanium-doped silicon layer, wherein the conductive zone is formed in the germanium-doped silicon layer, in the undoped silicon layer and in the adjacent surface of the hole apertures.

The electrically active dopant is introduced by outdiffusion into the conductive zone from a layer doped with the electrically active dopant.

In the preferred embodiment, the conductive zone is provided with a dopant concentration of between $5.10^{19}$ cm$^{-3}$ and $8.10^{20}$ cm$^{-3}$ for phosphorus and of between $5.10^{19}$ cm$^{-3}$ and $5.10^{21}$ cm$^{-3}$ for germanium or between $3.10^{19}$ cm$^{-3}$ and $3.10^{20}$ cm$^{-3}$ for boron and $5.10^{19}$ cm$^{-3}$ and $5.10^{21}$ cm$^{-3}$ for germanium.

In a method according to the invention, the electrochemical etching for forming the hole apertures is carried out in a fluoride-containing, acidic electrolyte with which the principal surface is in contact and a voltage is applied between the electrolyte and the silicon substrate in such a way that the silicon substrate is connected as an anode, and a back of the silicon substrate situated opposite the principal surface is illuminated during the electrochemical etching.

In the method, the hole apertures are generated with diameters in the range between 0.5 $\mu$m and 10 $\mu$m and with depths in the range between 50 $\mu$m and 300 $\mu$m, the hole apertures having an aspect ratio in the range between 30 and 300. The dielectric layer is formed by combined formation of SiO$_2$ and Si$_3$N$_4$ as a multilayer having a layer sequence SiO$_2$/Si$_3$N$_4$/SiO$_2$. The conductive layer is formed by gas-phase deposition of doped polysilicon.

In the method according to the invention, a multiplicity of hole apertures is generated in a principal surface of an n-doped silicon substrate by electrochemical etching. The electrochemical etching preferably takes place in a fluoride-containing, acidic electrolyte, with which the principal surface is in contact and a voltage is applied between the electrolyte and the silicon substrate in such a way that the silicon substrate is connected as an anode. In this process, a back of the silicon substrate which is opposite the principal surface is illuminated.

A conductive zone which is provided with electrically active dopant is generated along the surface of the hole apertures. In this connection, dopant which determines the conductivity of the conductive zone is described as an electrically active dopant. In particular, phosphorous, boron or arsenic is used as an electrically active dopant.

A layer which is doped with germanium and which dopes the conductive zone with germanium is generated on the surface of the hole apertures.

According to a first embodiment, the conductive zone is generated by outdiffusion of germanium from a layer doped with germanium. In the outdiffusion from a germanium-doped layer, germanium is diffused to a depth of 0.2 to 0.5 $\mu$m at a temperature of 1400 degrees K. in 4 to 25 hours. At a temperature of 1473 degrees K., a diffusion length of 0.2

µm is achieved after 0.56 hours and a diffusion length of 0.5 µm after 3.5 hours. Such diffusion times are acceptable in a manufacturing process.

Preferably, the germanium-doped layer is formed from silicate glass which is deposited-in a CVD deposition at atmospheric pressure (APCVD) using a process gas containing $Ge(OCH_3)_4$ and $Si(OC_2H_5)_4$. Germanium-doped silicate glass produced using this process gas and $O_3$ is disclosed by S. Fisher et al., in the Solid Publication State Technology, Sept. 1993, pages 55 to 64. It was proposed an as intermediate oxide. The possibility of using it as a diffusion source for germanium is not disclosed in the literature. In the method according to the invention, $O_2$ or $O_3$ is added during the deposition. The use of $O_2$ means a process simplification. If $O_3$ is used an improved edge coverage is achieved.

It is within the scope of the invention to diffuse germanium and the electrically active dopant simultaneously into the surface of the hole apertures to produce the conductive zone.

In cases in which the diffusion length of the electrically active dopant is greater than that of germanium, it is advantageous to diffuse germanium with a time lead suitable for essentially overlapping the doping profile of the germanium and the electrically active dopant in the conductive zone. This is done, for example, by applying a silicate-glass layer which is doped with the electrical dopant, in particular phosphorus, boron or arsenic and out of which the electrically active dopant is outdiffused to the germanium-doped layer after the lead time for the germanium diffusion. Alternatively, the electrically active dopant may also be introduced by gas-phase diffusion.

To minimize mechanical stresses, it is within the scope of the invention to carry out the germanium diffusion and the diffusion of the electrically active dopant repeatedly. For this purpose, in particular, the layers used as dopant source are removed and applied again.

The germanium-doped layer is removed before a dielectric layer and an electrically conductive layer on top of the latter are applied to the surface of the conductive zone. The conductive layer and the conductive zone are each provided with a contact. The contacts may be arranged either in the region of the principal surface or on the principal surface and the back.

According to another embodiment of the invention, a germanium-doped silicon layer is grown by epitaxy on the surface of the hole apertures. For this purpose, a germanium-containing compound, in particular $GeH_4$ is added during the epitaxy step. The germanium-doped layer is preferably grown in a thickness of between 10 and 100 nm. The electrically active dopant is then introduced by gas-phase diffusion or outdiffusion from a layer provided with the electrically active dopant. In this case, the conductive zone forms in the silicon layer grown during the epitaxy step and the adjacent surface of the hole apertures. Temperature and time for the outdiffusion of the electrically active dopant are chosen in such a way that the divergent germanium profile is brought to coincidence with the profile of the electrically active dopant.

According to a further embodiment, the electrically active dopant is incorporated in the lattice during the epitaxy step.

To equalize extremely different diffusion lengths of germanium and the electrically active dopant, it is advantageous to deposit a further undoped silicon layer by epitaxy on the germanium-doped silicon layer before the electrically active dopant is driven in.

In this embodiment of the invention, the germanium-doped silicon layer and, optionally, the further silicon layer, which are grown by epitaxy remain on the surface of the hole apertures as part of the conductive zone. The dielectric layer and the conductive layer are then applied to the surface of the conductive zone.

In the method according to the invention, the germanium doping is intended to compensate for the mechanical strain in the conductive zone caused by the doping with electrically active dopant. Since the depth of the hole apertures is up to 300 µm and the total thickness of normally used silicon wafers is around 600 µm, the mechanical strain in the conductive zone is associated with a noticeable bending of the wafer. The mechanical strains are brought about by the fact that, during the doping, an electrically active dopant atom whose covalent bond radius differs from that of the silicon atom is incorporated at a substitutional lattice site in the silicon crystal. A phosphorus atom has, for example a 6% smaller covalent bond radius in the silicon crystal than a corresponding silicon atom, with the result that it causes a contraction of the crystal lattice. This effect is the stronger, the higher the dopant concentration.

The lattice distortion may result in a high dislocation density. If a multiplicity of silicon capacitors is produced in a silicon wafer, a wafer bending results. Since manufacturing systems which are normally used, such as, for example, conventional lithography units, are exclusively designed for flat substrates, it is important, with a view to optimized manufacturing yields, to avoid bending of substrate wafers which is associated with the process.

In the method according to the invention, the disturbance of the lattice by the electrically active dopant is compensated for by an additional doping with germanium. In this process, the dopant concentrations are adjusted to one another in such a way that a bending is avoided. For a boron concentration of $1.1 \times 10^{20}$ $cm^{-3}$, a germanium concentration of $8 \times 10^{20}$ $cm^{-3}$ is necessary for this purpose. Provided the distortion is elastic, there is a linear relationship between the two concentrations, i.e. lower boron concentrations require a correspondingly lower germanium concentration. If phosphorus is used with a concentration of, for example, $1 \times 10^{20}$ $cm^{-3}$, a germanium concentration of approximately $1.2 \times 10^{20}$ $cm^{-3}$ is adequate. Provided the maximum elastic distortion $\Delta l_{max}/l$ of approximately $5 \times 10^{-4}$ is not exceeded, the concentrations necessary are approximately proportional. However, as a result of lattice mismatch or exceeding the elastic range, other concentration ratios may also be needed to avoid the bending.

Germanium has the advantage that, on the one hand, it is electrically neutral and, on the other hand, it has a high solubility in silicon and that it has a greater covalent bond radius in the silicon crystal than the electrically active dopants boron and phosphorus which are normally used to produce silicon components.

BRIEF DESCRIPTION OF THE DRAWINGS

The invention is explained in greater detail below by reference to exemplary embodiments and the figures.

DETAILED DESCRIPTION OF THE PREFERRED EMBODIMENTS

Figure 1:
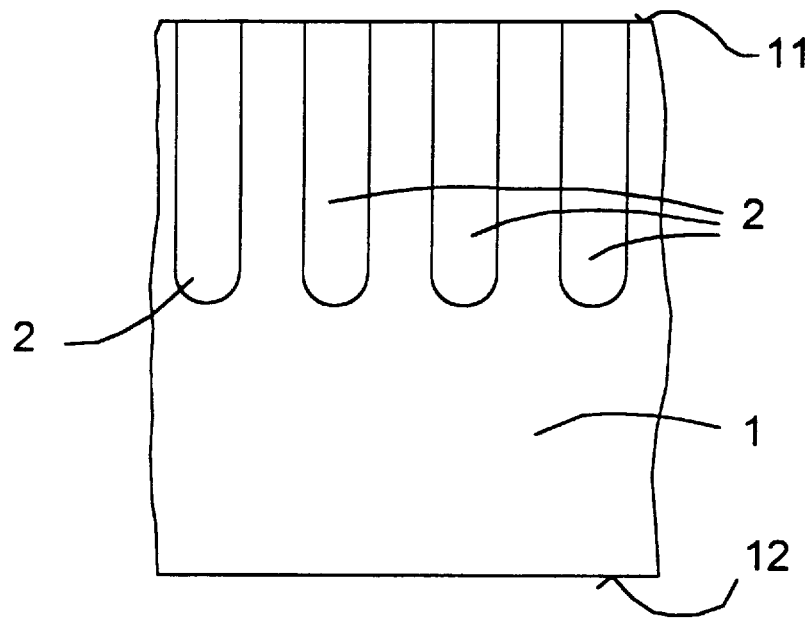
FIG. 1 is a side cross section which shows a silicon substrate with hole apertures.

A silicon substrate 1 composed of n-doped monocrystalline silicon having a resistivity of 5 ohm×cm is provided with a multiplicity of hole apertures 2 at a principal surface 11 by electrochemical etching (see FIG. 1).

For this purpose, the principal surface 11 is brought into contact with an electrolyte. A 6%-strength by weight hydrofluoric acid (HF) is for example used as an electrolyte. A potential of 3 volts is applied to the silicon substrate 1 as an anode. The silicon substrate 1 is illuminated from a back 12 which is situated opposite the principal surface 11. In this process, a current density of 10 mA/cm$^2$ is set. In the electrochemical etching, minority charge carriers migrate in the n-doped silicon to the principal surface 11, which is in contact with the electrolyte. A space charge zone forms at the principal surface 11. Since the field strength in the region of depressions in the principal surface 11 is greater than outside them, the minority charge carriers migrate preferentially to these points. This results in a structuring of the principal surface 11. The deeper an initially small irregularity due to etching is, the more minority charge carriers migrate to that point and the stronger is the etching attack at this position.

The hole apertures 2 begin to grow outwards from the irregularities in the principal surface 11, the irregularities being present with random distribution in any surface. To achieve a uniform distribution of the hole apertures 2, it is advantageous to provide the principal surface 11 with irregularities in a controlled manner before the electrochemical etching, which irregularities act as a nucleus for the etching attack in the subsequent electrochemical etching. These irregularities can be produced, for example, with the aid of conventional photolithography.

After an etching time of approximately 180 minutes, the hole apertures 2 have a diameter of 2 $\mu$m, and having reached a depth of 175 $\mu$m. The silicon substrate 1 is then thoroughly rinsed with water.

Figure 2:
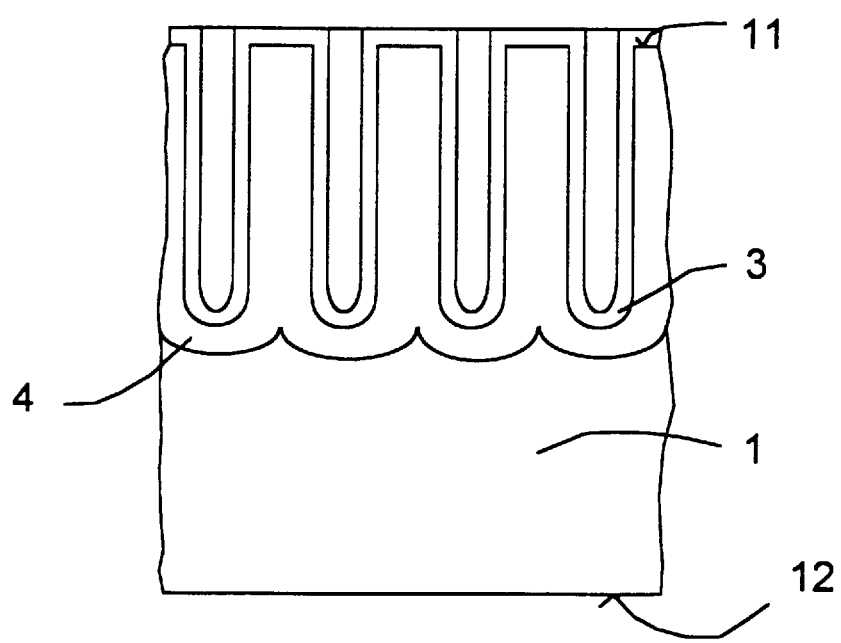
FIG. 2 is a side cross section which shows the silicon substrate after introducing a germanium-doped layer and outdiffusing germanium.

A germanium-doped layer 3 is deposited at atmospheric pressure in a CVD method. The germanium-doped layer 3 is produced from doped silicate glass using a process gas containing Si(OC$_2$H$_5$)$_4$, Ge(OCH$_3$)$_4$ and O$_3$. Atmospheric pressure and a temperature in the range 300° C. to 500° C. is set during this process. The germanium-doped layer 3 is deposited in a thickness of 100 nm to 300 nm (see FIG. 2).

In a heat-treatment step at 1400 degrees K., a germanium-doped zone 4 is generated in a diffusion time of 25 hr.

Figure 3:
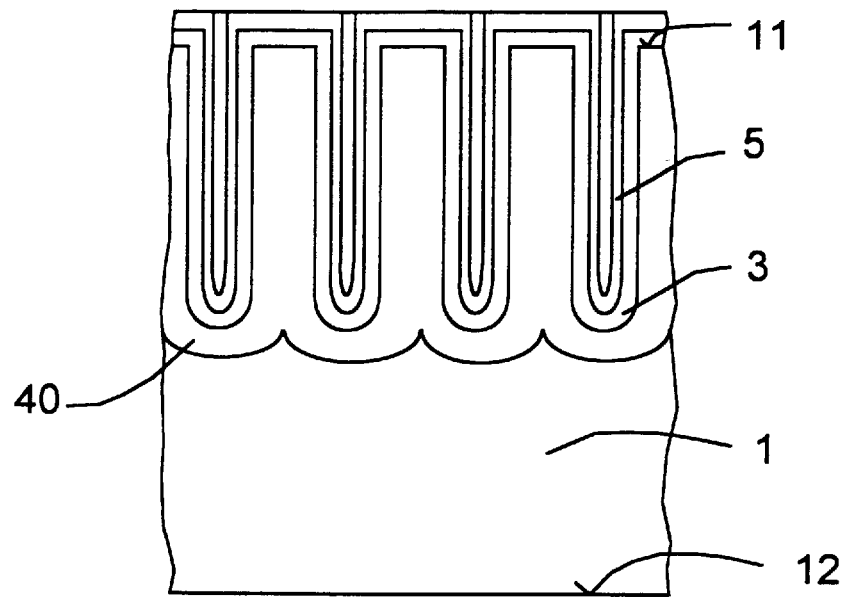
FIG. 3 is a side cross section which shows the silicon substrate after applying a layer doped with an electrically active dopant and outdiffusing said dopant.

A layer 5 doped with an electrically active dopant is subsequently deposited on the germanium-doped layer 3 (see FIG. 3) in a CVD method. Boron or phosphorus, for example, is used as electrically active dopant. The doped layer 5 is deposited in a thickness of, for example, 100 nm. In a further heat-treatment step at 1400 degrees K., the electrically active dopant and the germanium are jointly driven in further. After a diffusion time of 2.5 hr., the dopant profiles of germanium and the electrically active dopant coincide and form a conductive zone 40. In the case of boron, this takes approximately 9 hours. A dopant concentration of $1.1 \times 10^{20}$ cm$^{-3}$ for boron and $8 \times 10^{20}$ cm$^{-3}$ for germanium or $1 \times 10^{20}$ cm$^{-3}$ for phosphorus and $1.2 \times 10^{20}$ cm$^{-3}$ for germanium is established in the conductive zone 40. This achieves, on the one hand, an adequate conductivity of the doped zone 40, which forms a capacitor electrode in the silicon capacitor and, on the other hand, effectively avoids a bending of the silicon substrate 1. The depth of the conductive zone 40 is, for example, 0.5 $\mu$m.

The germanium-doped layer 3 and the doped layer 5 are removed with 10%-strength by weight hydrofluoric acid.

Figure 4:
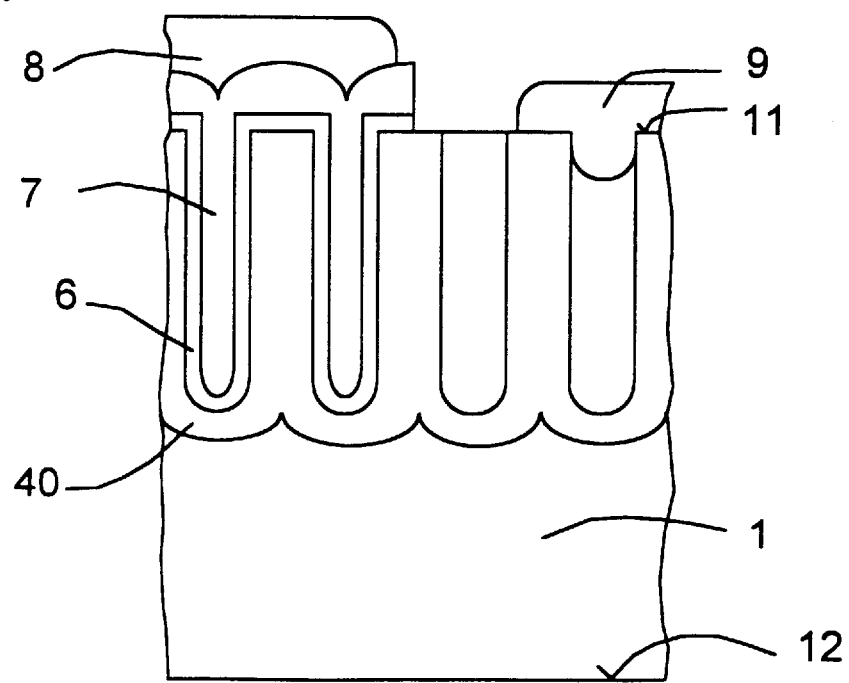
FIG. 4 is a side cross section which shows a silicon substrate after deposition of a dielectric layer and of a conductive layer and formation of contacts to the conductive layer and the conductive zone.

To produce the silicon capacitor, a dielectric layer 6 and a conductive layer 7 are then applied and structured (see FIG. 4). The dielectric layer 6 is preferably formed by combined generation of SiO$_2$ and Si$_3$N$_4$ as a multiple layer having a layer sequence SiO$_2$/Si$_3$N$_4$/SiO$_2$, since this material has a sufficiently low defect density for a large-area capacitor. The conductive layer 7 is formed, for example, from n$^+$-doped polysilicon. A first contact 8 is applied to the surface of the conductive layer 7 and a second contact 9 is applied to that surface of the doped zone 40 which is laid bare by structuring the dielectric layer 6 and the conductive layer 7. The first contact 8 and the second contact 9 are formed, for example, from aluminium.

Figure 5:
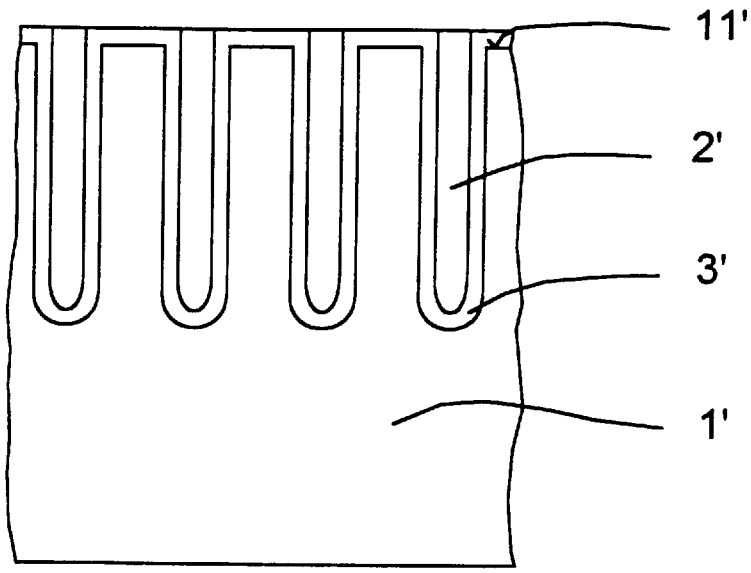
FIG. 5 is a side cross section which shows a silicon substrate with hole openings on whose surface a germanium-doped silicon layer is grown.

In a further exemplary embodiment, hole apertures 2' are formed by electrochemical etching in a principal surface 11' of a silicon substrate 1', as described by reference to FIG. 1 (see FIG. 5). The resistivity of the silicon substrate 1' and the dimensions of the hole apertures 2' correspond to those described by reference to FIG. 1.

In an epitaxial reactor, a germanium-doped silicon layer 3' which has a thickness of 10 to 100 nm is grown onto the surface of the hole apertures 2'.

The epitaxy takes place using SiH$_2$Cl$_2$, GeH$_4$ and inert carrier gases at a temperature of 575° C. and a pressure of 66.7 Pa (0.5 torr). The mixing ratio of SiH$_2$Cl$_2$ and GeH$_4$ is adjusted in such a way that the germanium-doped layer 2' contains 10 atomic percent of germanium.

Figure 6:
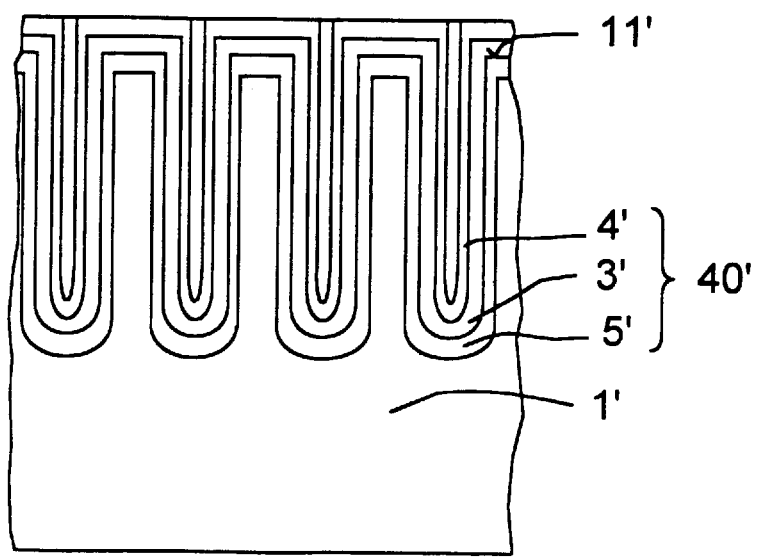
FIG. 6 is a side cross section which shows the silicon substrate after growing a further undoped silicon layer and driving in electrically active dopant to form a conductive zone.

Using SiH$_2$Cl$_2$ and inert carrier gases, an undoped silicon layer 4' is then grown in the epitaxial reactor in a thickness of, for example, 20 nm (see FIG. 6). In this process, a temperature of 650° C. and a pressure of 66.7 Pa (0.5 torr) is maintained in the epitaxial reactor.

An electrically active dopant, for example boron or phosphorus, is then diffused into the undoped silicon layer 4' and the germanium-doped silicon layer 3'. This takes place, for example, by gas-phase diffusion using phosphine or borane. In this process, a temperature of 1400 degrees K. is maintained. During the indiffusion of the electrically active dopant, a divergence of the germanium profile results in the germanium-doped silicon layer 3'. During this process, germanium diffuses both into the undoped silicon layer 4' and into the adjacent surface of the silicon layer 1'. The diffusion temperature and diffusion time are adjusted in such a way that the electrically active dopant is diffused precisely as far into the silicon substrate 1' as the germanium. A doped zone 5' consequently forms at the surface of the hole apertures. The dopant profiles of the germanium and of the electrically active dopant extend over the undoped silicon layer 4', the germanium-doped silicon layer 3' and the doped zone 5', which jointly form a conductive zone 40'.

The indiffusion of the electrically active dopant can also take place by depositing a suitably doped silicate-glass layer and outdiffusion from the silicate-glass layer, which has to be removed again after the outdiffusion.

Figure 7:
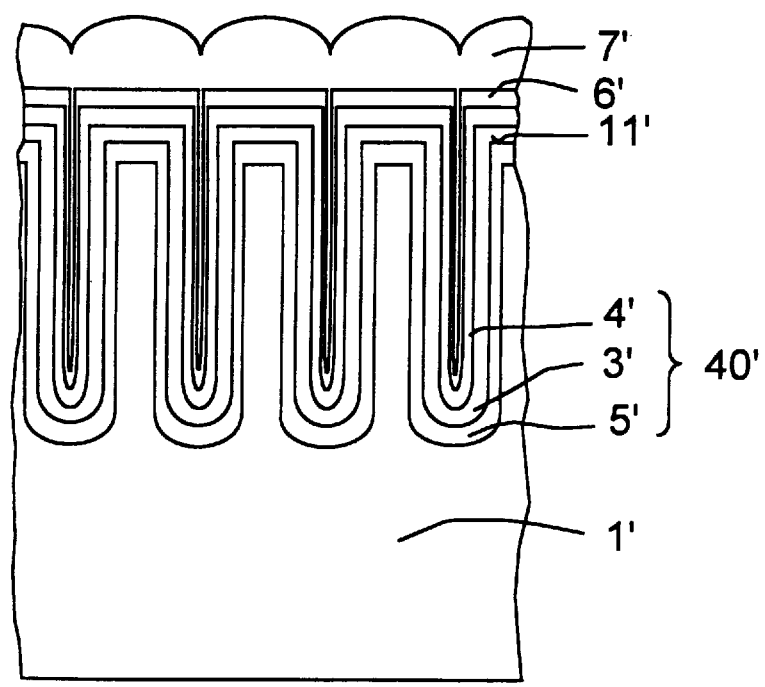
FIG. 7 is a side cross section which shows the silicon substrate after deposition of a dielectric layer and a conductive layer.

The silicon capacitor is produced by depositing a dielectric layer 6', for example, composed of $SiO_2/Si_3N_4/SiO_2$ and a conductive layer 7' composed, for example, of $n^+$-doped polysilicon (see FIG. 7). The conductive layer 7' and the conductive zone 40' are then provided with metallic contacts (not shown). The contacts may both be arranged in the region of the principal surface 11', a suitable structuring of the dielectric layer 6' and of the conductive layer 7' being necessary. Alternatively, one contact may be arranged on the conductive layer in the region of the principal surface and one contact on a back situated opposite the principal surface 11'.

Although other modifications and changes may be suggested by those skilled in the art, it is the intention of the inventors to embody within the patent warranted hereon all changes and modifications as reasonably and properly come within the scope of their contribution to the art.

We claim:

1. A method of producing at least one silicon capacitor, comprising the steps of:

generating a multiplicity of hole apertures by electrochemical etching in a principal surface of an n-doped silicon substrate, generating a conductive zone provided with electrically-active dopant along a surface of said multiplicity of hole apertures, generating a germanium-doped layer, which dopes the conductive zone with germanium, on the surface of the hole apertures, applying a dielectric layer and a conductive layer to a surface of the conductive zone, and providing a contact for the conductive layer and for the conductive zone.

2. A method according to claim 1, wherein said step of generating said germanium-doped layer includes doping the conductive zone with germanium by outdiffusion from the germanium-doped layer.

3. A method according to claim 2, wherein said step of generating said germanium-doped layer includes CVD deposition at atmospheric pressure using a process gas containing $Ge(OCH_3)_4$ and $Si(OC_2H_5)_4$.

4. A method according to claim 1, wherein said step of generating said germanium-doped layer includes forming a silicon layer which is doped with germanium in situ by adding a germanium-containing compound during an epitaxy step by epitaxy on the surface of the hole apertures.

5. A method according to claim 4, further comprising the steps of:

growing a further undoped silicon layer by epitaxy on the germanium-doped layer, wherein said step of generating said conductive zone forms the conductive zone in the germanium-doped layer and in said further undoped silicon layer and in the surface of said multiplicity of hole apertures.

6. A method according to claim 1, wherein said step of generating the conductive zone introduces the electrically active dopant by outdiffusion into the conductive zone from a layer doped with the electrically active dopant.

7. A method according to claim 1, wherein the conductive zone is provided with a dopant concentration of between $5.10^{19}$ $cm^{-3}$ and $8.10^{20}$ $cm^{-3}$ for phosphorus and of between $5.10^{19}$ $cm^{-3}$ and $5.10^{21}$ $cm^{-3}$ for germanium or between $3.10^{19}$ $cm^{-3}$ and $3.10^{20}$ $cm^{-3}$ for boron and $5.10^{19}$ $cm^{-3}$ and $5.10^{21}$ $cm^{-3}$ for germanium.

8. A method according to claim 1, wherein said step of generating the multiplicity of hole apertures is carried out by electrochemical etching in a fluoride-containing, acidic electrolyte with which the principal surface is in contact and applying a voltage between the electrolyte and the silicon substrate in such a way that the silicon substrate is connected as an anode, and illuminating a back of the silicon substrate situated opposite the principal surface during the electrochemical etching.

9. A method according to claim 8, wherein the hole apertures are generated with diameters in the range between 0.5 $\mu$m and 10 $\mu$m and with depths in the range between 50 $\mu$m and 300 $\mu$m, the hole apertures having an aspect ratio in the range between 30 and 300.

10. A method according to claim 1, wherein said step of applying said dielectric layer includes forming the dielectric layer by combined formation of $SiO_2$ and $Si_3N_4$ as a multilayer having a layer sequence $SiO_2/Si_3N_4/SiO_2$.

11. A method according to claim 1, wherein the conductive layer is formed by gas-phase deposition of doped polysilicon.

* * * * *